(12) United States Patent
Boomer et al.

(10) Patent No.: US 8,321,598 B2
(45) Date of Patent: Nov. 27, 2012

(54) METHOD AND CIRCUIT FOR CAPTURING KEYPAD DATA SERIALIZING/DESERIALIZING AND REGENERATING THE KEYPAD INTERFACE

(75) Inventors: James Boomer, Monument, CO (US); Oscar Freitas, Cape Elizabeth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 291 days.

(21) Appl. No.: 12/112,176

(22) Filed: Apr. 30, 2008

(65) Prior Publication Data

US 2009/0106462 A1 Apr. 23, 2009

Related U.S. Application Data

(60) Provisional application No. 60/915,803, filed on May 3, 2007.

(51) Int. Cl.
*G06F 3/00* (2006.01)

(52) U.S. Cl. ......... 710/8; 710/1; 710/5; 710/15; 710/19; 710/29

(58) Field of Classification Search .................. 710/1, 5, 710/8, 15, 19, 29
See application file for complete search history.

(56) References Cited

U.S. PATENT DOCUMENTS

| | | | |
|---|---|---|---|
| 3,746,793 A | 7/1973 | Sachs et al. | |
| 4,042,777 A | 8/1977 | Bequaert et al. | |
| 4,365,296 A * | 12/1982 | Ulmer | 709/232 |
| 4,939,735 A * | 7/1990 | Fredericks et al. | 714/798 |
| 5,402,121 A | 3/1995 | Noorbehesht | |
| 5,555,438 A * | 9/1996 | Blech et al. | 710/30 |
| 5,892,964 A * | 4/1999 | Horan et al. | 712/33 |
| 5,898,861 A * | 4/1999 | Emerson et al. | 703/23 |
| 6,070,204 A * | 5/2000 | Poisner | 710/100 |
| 6,538,595 B1 * | 3/2003 | Tucker et al. | 341/178 |
| 6,567,512 B1 * | 5/2003 | Hermanson et al. | 379/216.01 |
| 6,714,143 B2 * | 3/2004 | Ideura | 341/23 |
| 6,784,810 B2 * | 8/2004 | Falik et al. | 341/26 |
| 6,927,756 B1 * | 8/2005 | Hauck | 345/156 |
| 7,010,640 B2 * | 3/2006 | Hoshino et al. | 710/313 |
| 2001/0013859 A1 * | 8/2001 | Roylance | 345/168 |

(Continued)

OTHER PUBLICATIONS

"Notification of Transmittal of the International Search Report and the Written Opinion of the International Searching Authority, or the Declaration", International Application No. PCT/US2008/005660, published by European Patent Office, Mailed Aug. 25, 2008, 12 pages.

*Primary Examiner* — Chun-Kuan Lee
*Assistant Examiner* — Jasjit Vidwan
(74) *Attorney, Agent, or Firm* — Schwegman, Lundberg & Woessner, P.A.

(57) ABSTRACT

A serializer/deserializer interfacing a keypad or keyboard to a processing system is illustrated. However, to minimize wires on intervening cables, a serializer and deserializer is inserted between the processor system and the keypad forming a virtual keypad. The processor scans the deserializer as if it were the keypad and the keypad is scanned by the serializer as if it were the processor. The serializer converts the scanning of the keypad into a serial bit stream and clock that is sent to the deserializer. The deserializer accepts the serial bit stream and reconfigures the data into a response that mimics the response of the physical keypad. In one embodiment an actual second keypad is formed in the deserializer and activated as the first keypad is activated.

12 Claims, 3 Drawing Sheets

U.S. PATENT DOCUMENTS

| | | | |
|---|---|---|---|
| 2001/0032280 A1* | 10/2001 | Osakada et al. | 710/129 |
| 2002/0099980 A1* | 7/2002 | Olarig | 714/43 |
| 2002/0103987 A1* | 8/2002 | Jaffrey | 712/32 |
| 2002/0174375 A1* | 11/2002 | Oh | 713/500 |
| 2002/0174381 A1* | 11/2002 | Olarig et al. | 714/25 |
| 2003/0018892 A1* | 1/2003 | Tello | 713/164 |
| 2003/0122691 A1* | 7/2003 | Olodort et al. | 341/22 |
| 2004/0090421 A1* | 5/2004 | Jamieson et al. | 345/168 |
| 2005/0066000 A1* | 3/2005 | Liaw et al. | 709/204 |
| 2005/0097191 A1* | 5/2005 | Yamaki et al. | 709/219 |
| 2005/0151995 A1* | 7/2005 | Hauser et al. | 358/1.15 |
| 2005/0231399 A1 | 10/2005 | Fowler et al. | |
| 2006/0217965 A1* | 9/2006 | Babu | 704/9 |
| 2006/0258289 A1* | 11/2006 | Dua | 455/41.3 |
| 2007/0042767 A1* | 2/2007 | Stepanian | 455/420 |
| 2007/0061491 A1* | 3/2007 | Kerdemelidis et al. | 710/1 |
| 2007/0273560 A1* | 11/2007 | Hua et al. | 341/33 |
| 2008/0174566 A1* | 7/2008 | Zabala et al. | 345/173 |

* cited by examiner

METHOD AND CIRCUIT FOR CAPTURING KEYPAD DATA SERIALIZING/DESERIALIZING AND REGENERATING THE KEYPAD INTERFACE

RELATED APPLICATION

The present application is related to and claims the benefit of the provisional patent application, Serial No. 60/915,803, filed on May 3, 2007, and which provisional application is of the same inventorship, title and ownership as the present application. The provisional application is hereby incorporated herein by reference.

BACKGROUND OF THE INVENTION

1. Field of the Invention

The present invention is related to key pads, and more particularly to key matrices that are scanned for decoding which key, if any, is depressed.

2. Background Information

Most keypad and key board interfaces, especially in cell phones and other mobile devices, are implemented with parallel wires that carry scan and sense signals. For example, 12 keys might be arranged with three scan lines and four sense lines to be able to decode which key is being depressed. Similarly, twenty keys might require four scan lines and five sense lines. Of course, other combinations of scan and sense lines may be used.

The point is that the typical micro-processor in cell phones requires a parallel connection to a keypad that traverses the hinge flex cable. The parallel connections carry the scan lines that are driven by the micro-processor and the parallel sense lines that return from the keypad. As the number of keys increases and devices become smaller, it would be advantageous to reduce the number of wires sent across the hinge flex cable of a flip or slider cell phone. The present invention provides a more efficient, more reliable use of wires in a flex cable (sometimes called flex circuit). More wires in the flex cable suggest a larger cable or smaller wires of a combination of both. Either approach reduces reliability.

The present invention provides for a reduced number of wires that traverse the hinge compared to the parallel wires of the prior art.

SUMMARY OF THE INVENTION

Illustratively, the present invention provides a virtual keypad (or keyboard) interface to a computer system. The computer system is arranged to scan a keypad directly, but the present invention provides a serializer/deserializer between the keypad and the computer system. The computer system scans the deserializer which acts as a virtual keypad, and the serializer scans the keypad as if the serializer was the computer system. The serializer drives the keypad scan signals and receives the keypad sense signals in the typical fashion. The serializer converts the results to a serial set of data that is sent over a cable, typically a flex cable. At the other end of the flex cable a deserializer receives the serial set of data and reconverts it back to the scan and sense line format of the keypad. The deserializer is connected, illustratively, to the scan and sense lines of the typical micro-processor that might be found in cell phones. In practice, the deserializer logically receives signals from the micro-processor on the scan lines and return signals on the sense lines, and those signals mimic what the computer system would receive directly from the keypad.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
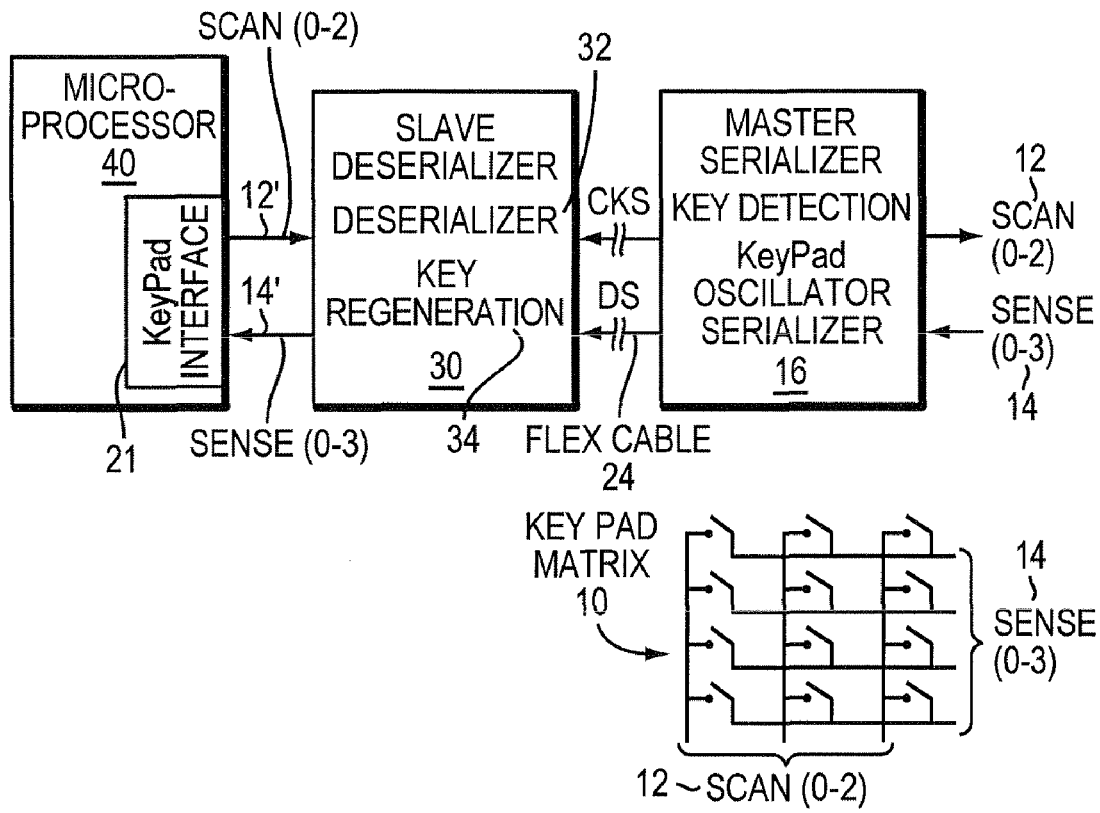
FIG. 1 is a schematic block diagram illustrating one embodiment of the present invention.

FIG. 1 shows a schematic block diagram illustrating the electronic configuration between a key pad matrix 10 having twelve keys arranged in three scan lines 12 and four sense lines 14.

The keypad scan lines 12 are driven from the Master Serializer 16 and the four keypad sense lines 14 return to the Master Serializer 16. The Master Serializer provides a "any key depressed" detection circuit, an oscillator 20 and a serializer 22.

Still referring to FIG. 1, the Master Serializer connects to the keypad matrix 10 on one side and a hinged flex cable 24 on the other. The flex cable connects to the Slave Serializer 30, but uses only two wires each carrying signals that traverse the hinge 24. One is a clock signal CKS and the second is a serial data signal DS. The clock signals provide an edge with which settled data may be strobed into the Slave Deserializer 30 at the far end of the hinge 24.

The Slave Deserializer 30 receives the clock (CLK) and serial data (DS) signals from the flex cable 24 and deserializes 32 and temporarily stores the scan/sense signals, to regenerate 34 logically the key pad matrix data.

The Slave Deserializer 30 receives scan signals on the lines 12' from the microprocessor 40 and returns thereto sense lines 14' that are duplicates of those associated with the key matrix 10. The operation is as if the Master Serializer and Slave Deserializer were not there.

Figure 2:
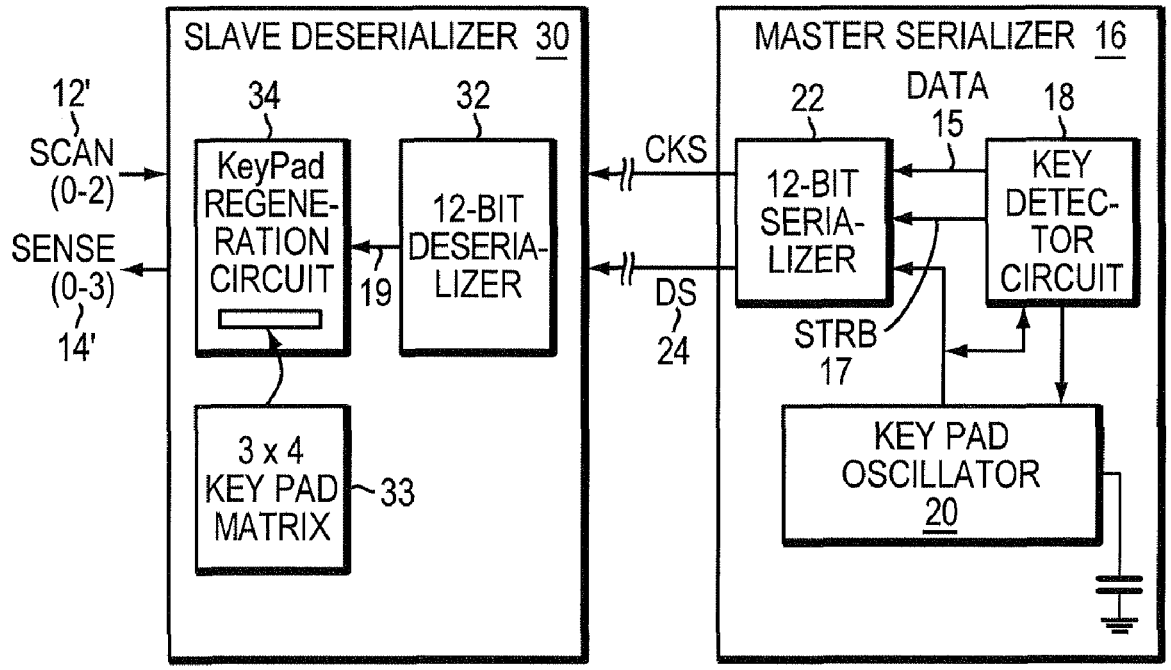
FIG. 2 is a schematic block diagram of part of the diagram of FIG. 1.

FIG. 2 illustrates the functional circuits in the Master Serializer 16 and the Slave Deserializer 30 in more detail. Here when one key is depressed at the keypad 10, a connection is made between one scan line 12 and one sense line 14. That connection is sensed by the key detector circuit 18. An oscillator 20 provides a clock signal to the key detector circuit and the serializer 22. A signal is repetitively sent out on the scan lines 12 to the key pad, and when one signal returns on the sense lines 14, a key was depressed. Data is formatted in the key detector and presented in a twelve bit parallel interface 15 with a loading strobe 17 to the serializer 22. Twelve bits (binary coded) allow a full keyboard with shift functions, etc. to be attached to be used in some applications. The form of the parallel data is arbitrary as the designer may determine.

The serial data DS is sent out by the serializer 22 over the flex cable 24 to the deserializer along with the clock CKS. The deserializer receives the DS signal and strobes the data into a register using the CKS signal. When all twelve bits have been loaded, the deserializer presents twelve data lines 19 to the keypad regenerator 34.

In this example with twelve keys, the micro-processor drives each of the three scan lines 12' one at a time and monitors the four sense lines 14.'. The keypad regenerator directs one of those scan lines to one sense line. The specific scan line that results in a specific sense line signal being returned to the micro-processor is the identical scan/sense combination that would result if the keypad scan and sense lines were directly attached to the micro-processor keypad interface 21.

Still referencing FIG. 2, the key regeneration module may comprise another mirror switch matrix 33, typically of analog (transistor) switches (for size considerations) that is a duplicate in size (rows and columns) as the keypad matrix 10. Here the deserializer 32 will activate the position (row and column) switch as was actually depressed in the keypad matrix 10.

Figure 3:
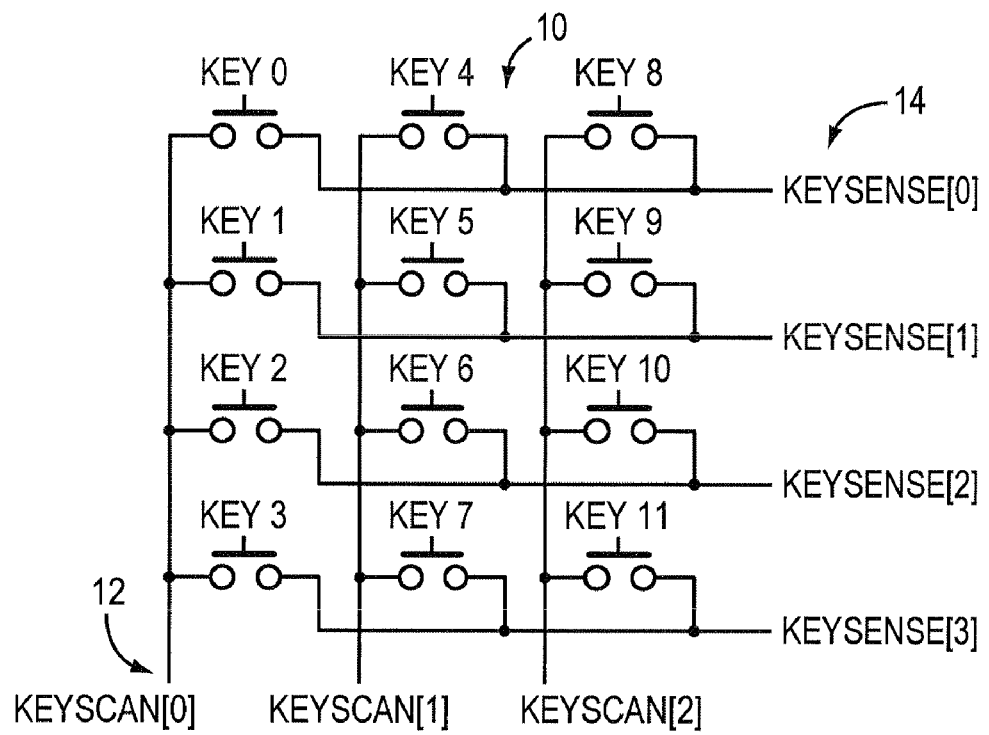
FIG. 3 is a schematic illustrating scanning a key pad matrix.

FIG. 3 illustrates one implementation illustrating a matrix of physical switches. Three scan lines 12 enter the key matrix 10 and four sense lines 14 exit. The operation is understood as follows: when a key, say Key5, is depressed only KEYSCAN[1] travels through KEY5 to KEYSENSE[1] and there are no signals on any other sense line 14. For example, if a logic true signal appears only at KEYSCAN[1], that logic signal will only appear at KEYSENSE[1] when Key5 is depressed. Similarly, if the oscillator signal 20 may be used by the key detector circuit to drive one scan line at a time, that oscillator signal will only appear at the sense output associated with the depressed key. Knowing the order of scanning and the order of which sense line is true at the same time, uniquely defines which key is depressed.

Figures 4A, 4B:
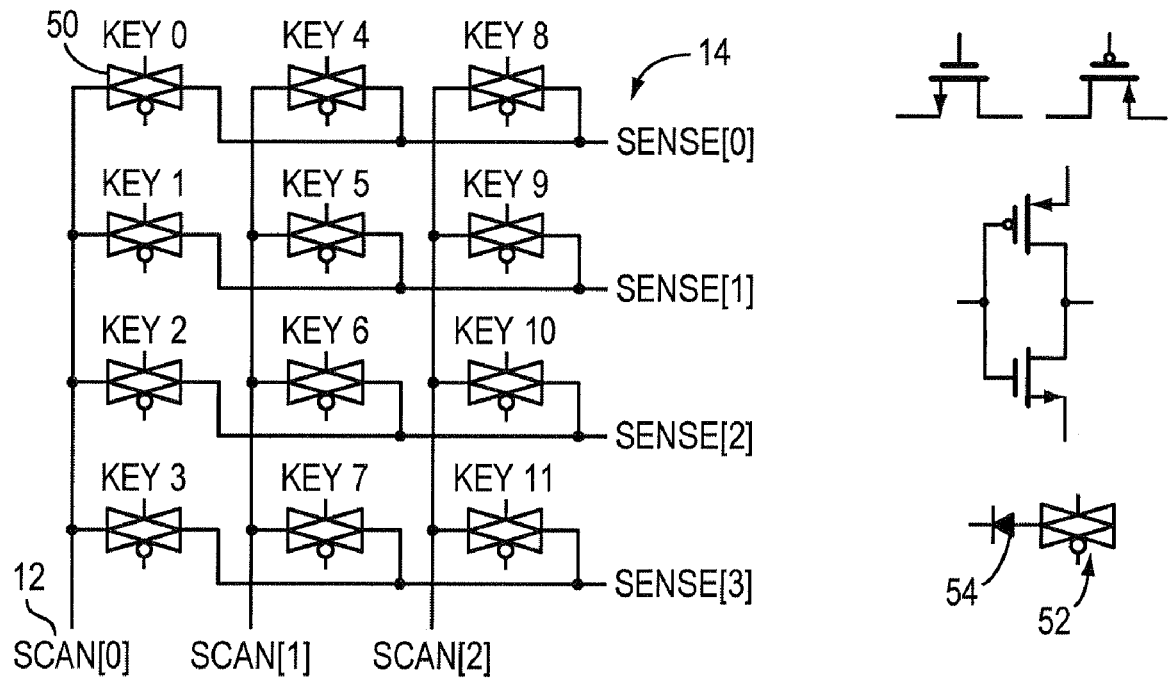
FIG. 4A is a schematic showing use of analog pass gates with a key pad matrix.
FIG. 4B is a schematic showing a diode helping the circuit operation.

FIG. 4A is a keypad matrix employing analog pass gates 50 rather than physical switches, one for each key. Logically the operation is the same as for the physical switches. The analog pass gates 50 typically employ FET transistors that, when a pass gate is turned on by a switch being depressed), transfer signals on the scan lines 12 to the sense lines 14 as described in FIG. 3. As shown, the physical key being depressed will turn on and enable the analog pass gate allowing the scan signal to pass through to the sense line.

The alternative design of FIG. 4B illustrates an added blocking diode 54 that reduces or suppresses ghosting and masks multiple key depressions. The ghosting may occur when there is feed through from one "on" pass gate to another over common lines (for example, if present power and ground lines). The multiple depressing occurs when humans sometimes "roll-over" from one key on to the next key on before the first is off.

As known in the art, the pass gates of FIG. 4A may be implemented with CMOS, NMOS, PMOS or with bipolar and combinations or hybrids as known in the art. FIG. 4B represents the CMOS, NMOS and PMOS components that may be arranged singly or in pairs again as known in the art. When using a CMOS, the activation may be arranged as a high or a low signal and the output the inverse as the designer may determine. When using NMOS the SENSE output lines may be pulled high, and when using PMOS they may be pulled low. See "pass gates" or switches from any component manufacturer.

Figure 5:
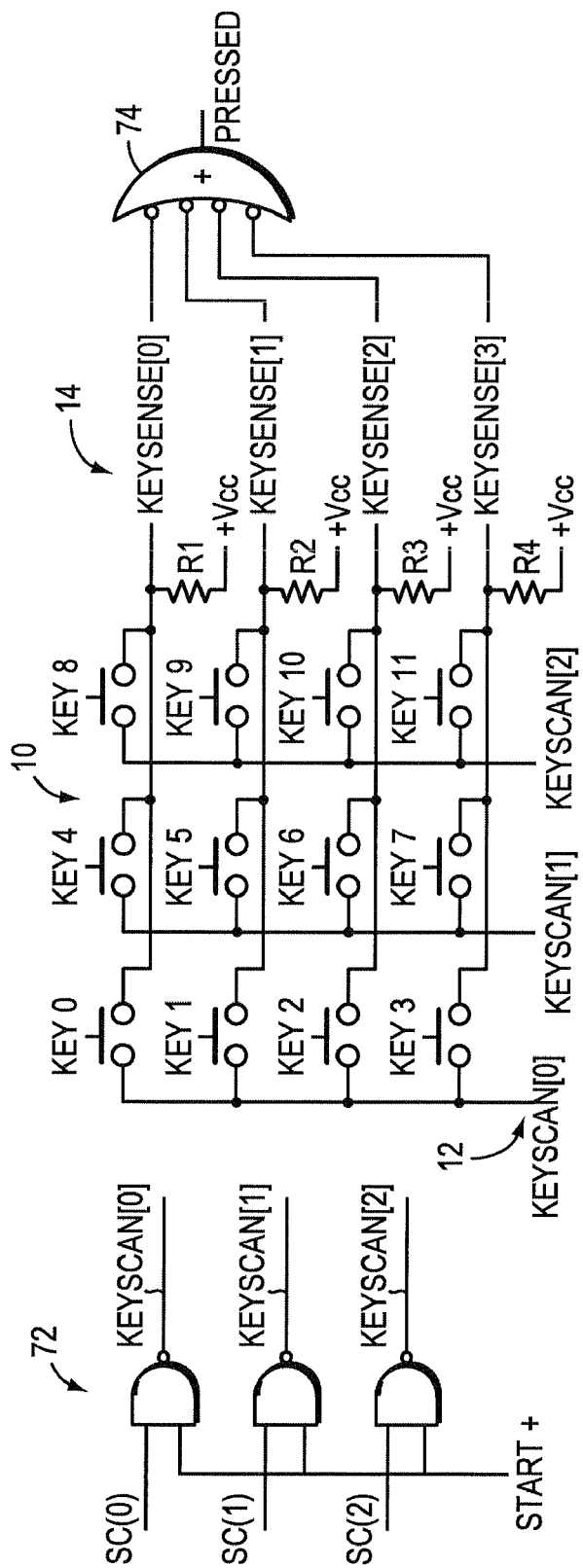
FIG. 5 is a schematic illustrating detection of a key being depressed and key scanning.

FIG. 5 illustrates a circuit, FIG. 3, that will detect when a key has been depressed. The START+ signal begins low (the system has not started) holding the scan lines KEYSCAN(0), (1) and (2) in different embodiments in a high impedance or three state condition via the collector "or" or three state gates 72. A collector or has a pull down active transistor that drives to ground, but no pull up components. When no switch is depressed, the resistors R1, R2, R3 and R4 are tied to +Vcc keeping the sense lines, KEYSENSE[0], [1], [2] and [3] high. In this state PRESS is also low. When any key is depressed, a low at any of the KEYSENSE lines drives the PRESS high via the NAND gate 74. In this embodiment, the scan lines, KEYSCAN(0), KEYSCAN(1) and KEYSCAN(2) are initially in a high impedance state. The Master Serializer drives the START high and scans the keypad by driving in sequence the scan lines, SC(0), (1), and (2) high.

If, for example, Key5 is depressed, when SC(0) goes low, the sense lines, KEYSENSE[0], [1], [2] and [3], remain high, but when SC(1) goes low, KEYSCAN(1) goes low, and via Key5, KEYSENSE[1] goes low. This signal is input by the Master Serializer 16 electronics indicating that Key5 was depressed. The Master Serializer encodes and sends it bit by bit to the Slave Deserializer 34.

Serializers and deserializers are well known logic integrated circuits in the art and may be found from many manufacturers. However, a microprocessor or digital signal processors may be arrange to perform serialization and deserialization as would be known to those skilled in the art.

Figure 6:
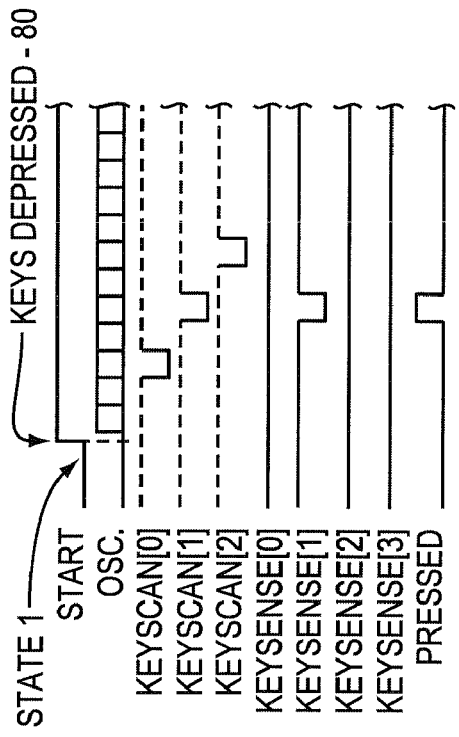
FIG. 6 are traces showing the signals of FIG. 5 when one key is depressed.

FIG. 6 illustrates the sequence of operations. When powered up, but no key is depressed, the signals are as in STATE 1. START is low and START− is high, and SC(0), SC(1) and SC(2) are low. When the keypad is scanned, START is asserted high. Master Serializer 16 scans the keypad by driving KEYSCAN(0), KEYSCAN(1) and KEYSCAN(2) low in sequence: SC(0) goes high, which drives KEYSCAN(0) low, but nothing else happening. However, when SC(1) goes high and KEYSCAN(1) goes low, and, via Key5, KEYSENSE[1] goes low. This is detected by the Master Serializer for encoding and sending. In one illustrative embodiment, the twelve keys are encoded one for one in a twelve bit serial word sent by the Master Serializer. In the case of Key5 being depressed (the sixth key), the serialized code sent to the deserializer, MSB left, is 000000100000. However, a binary (0101 for Key5) or hex or virtually any other code may be used to advantage.

Those skilled in the art will understand that many other logic configurations may be used to sense which key is depressed, encode (or format), serialize, deserialize and regenerate for the micro-processor to read. The micro-processor will "believe" it is interrogating the keypad directly, but only two lines will traverse the flex cable.

In some applications, hardware debouncers may be advantageously employed. Cross coupled gates may be used where double throw switches are used, or timing delay circuits or combinations with flip flops may be employed as known by those skilled in the art.

As would be known to those skilled in the art, other timing arrangements as well as other multiplexing arrangements may be used to advantage with the present invention. For example, the present disclosure uses an oscillator to detect and decode a key depression, but logic signals may be used, including voltage signals and/or current signals. In addition, there are many microprocessors that may be used to advantage. Additionally, very large silicon integration circuits with dedicated functions may be used, as well as one chip computers.

Although the implementation is shown herein as electronic circuits, those skilled in the art will understand that other electronic circuits may perform the same functions, and that systems employing software, firmware and/or hardware and combinations thereof may be used to advantage to accomplish equivalent functions.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A system for scanning a first keypad or keyboard, the system comprising:
   a computer system having a parallel interface arranged to generate first parallel scan line signals for a keypad and to receive first parallel sense line signals as if the computer system was attached directly to and scanning the keypad;
   a deserializer having an interface that receives the first parallel scan line signals from the computer system and generates the first parallel sense line signals to the computer system, wherein the deserializer duplicates the same response that a keypad would when directly attached to the computer system's parallel scan and sense lines;
   a serializer that generates second parallel scan line signals to and receives second parallel sense line signals from the keypad; wherein the serializer duplicates the parallel scan and sense line signals of the computer system, as if the computer system were directly attached to the keypad, wherein the parallel scan and sense lines signals are formatted into a serial bit stream by the serializer;
   a serial connection between the deserializer and the serializer, the serial connection arranged to send data in a serial bit stream on a single wire in the serial connection, wherein the bit stream is received by the deserializer and reformatted into a form that is returned to the computer system as if the keypad was directly attached to the computer system, wherein
   the system operates as if the deserializer and seralizer and serial connection were not present.

2. The system of claim 1 further comprising a circuit that detects when any key on the keypad was depressed.

3. The system of claim 1, wherein the connection between the serializer and the deserializer comprises a clock signal and the single wire serial data bit stream.

4. The system of claim 1 further comprising a second physical switch matrix in the deserializer with scan and sense lines that duplicate the scan and sense lines of the first keypad or keyboard, wherein the deserializer activates a key in the second keypad or keyboard that corresponds in row and column locations of the key activated in the first keypad or keyboard.

5. The system of claim 1 wherein the first keypad of keyboard comprises CMOS transistor switches wherein when the key may be activated by a high or a low signal and the output may be a low or high signal, respectively.

6. The system of claim 1 wherein the first keypad or keyboard comprises NMOS or PMOS switches.

7. The system of claim 1 further comprising a blocking diode in series with each key, wherein the blocking diode suppresses ghosting.

8. A process for scanning a first keypad or keyboard, the process comprising the steps of:
   sending first scan line signals to and receiving first sense line signals from a computer system having a parallel interface arranged to generate first scan line signals for scanning a keypad and to receive first sense line signals as if the first scan line signals and sense line signals were sent to and received from the keypad;
   duplicates in a deserializer, a keypad receiving the first scan line signals from the computer system and generating the first sense line signals,
   generating second scan line signals to and receiving second sense line signals from the keypad;
   formatting the second scan and sense line signals into a serial bit stream;
   transferring the serial bit stream on a single wire to the deserializer;
   receiving the serial bit stream by the deserializer;
   reformatting the receiving serial bit stream into a form that is returned to the computer system as if the keypad was attached directly to the computer system.

9. The process of claim 8 further comprising the step of detecting when any key on the keypad was depressed.

10. The process of claim 8, wherein the step of transferring comprises the steps of sending a clock signal suitable for loading a serial data bit.

11. The process of claim 8 wherein the step of reformatting the received serial bit stream comprises the steps of:
    determining which key in the first keypad was depressed, and
    activating a second keypad, wherein the second keypad duplicates the first keypad with respect to rows and columns, and wherein the key activated in the second keypad corresponds in row and column to the key activated in the first keypad.

12. The process of claim 8 further comprising the step of suppressing or blocking ghost signals by inserting a diode in series with each key switch.

* * * * *